United States Patent
Chae et al.

(10) Patent No.: US 8,092,926 B2
(45) Date of Patent: Jan. 10, 2012

(54) ORGANIC LIGHT EMITTING DIODE DEVICE AND METHOD OF MANUFACTURING THE SAME

(75) Inventors: Gee Sung Chae, Incheon (KR); Sung Hee Kim, Seoul (KR); Tae Han Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 649 days.

(21) Appl. No.: 12/005,620

(22) Filed: Dec. 28, 2007

(65) Prior Publication Data

US 2008/0191617 A1    Aug. 14, 2008

(30) Foreign Application Priority Data

Feb. 9, 2007  (KR) .................. 10-2007-0013768

(51) Int. Cl.
- *H01L 51/54* (2006.01)
- *H01J 1/63* (2006.01)
- *B05D 5/12* (2006.01)

(52) U.S. Cl. ........ 428/690; 428/917; 313/504; 313/506; 427/66

(58) Field of Classification Search .................. None
See application file for complete search history.

(56) References Cited

U.S. PATENT DOCUMENTS

| | | | |
|---|---|---|---|
| 2002/0109464 A1* | 8/2002 | Kawai et al. | 315/169.3 |
| 2007/0221914 A1* | 9/2007 | Becker et al. | 257/40 |

FOREIGN PATENT DOCUMENTS

KR    1020020037422    *    5/2002

OTHER PUBLICATIONS

Translation for KR 20020037422, published May 21, 2002.*
KR 2002037422 Figure and Derwent abstract, published May 21, 2002.*
KR 20020037422 Fig. 2a (document was published May 21, 2002).*
KR 20020037422 Fig. 2b (document was published May 21, 2002).*

* cited by examiner

*Primary Examiner* — Dawn L. Garrett
(74) *Attorney, Agent, or Firm* — McKennna Long & Aldridge, LLP

(57) ABSTRACT

An organic light emitting diode device includes an organic layer formed of a hole transport material or a hole injection material having a photocurable group. Therefore, the organic light emitting diode device can be formed using a wet process that is simple and can be used for a large substrate. Furthermore, the organic layer and an organic light emitting layer are less affected by a solvent. Thus, the lifespan of the organic light emitting diode device is increased and there is more freedom in selecting materials for the organic layer and the organic light emitting layer. A method of manufacturing the organic light emitting diode device is also disclosed.

15 Claims, 2 Drawing Sheets

ORGANIC LIGHT EMITTING DIODE DEVICE AND METHOD OF MANUFACTURING THE SAME

This application claims the benefit of Korean Patent Application No. 10-2007-0013768, filed on Feb. 9, 2007, which is hereby incorporated by reference for all purposes as if fully set forth herein.

BACKGROUND OF THE INVENTION

1. Field of the Invention

The present invention relates to an organic light emitting diode device and a method of manufacturing the organic light emitting diode device, and more particularly, to an organic light emitting diode device that can be manufactured using a wet process and a method of manufacturing the organic light emitting diode device.

2. Description of the Related Art

An organic light emitting diode device includes an anode, a cathode, and an organic light emitting layer disposed between the anode and the cathode. In the organic light emitting diode device, electrons and holes are supplied from the cathode and the anode to the organic light emitting layer and are recombined with each other. Then, light is emitted from the organic light emitting layer as the energy level of the electrons is changed from an unstable state (an excited state) to a stable state. An organic light emitting diode display device using such an organic light emitting diode device does not require a backlight unit that is required for a liquid crystal display device. Thus, the organic light emitting diode display device can be light and slim. Furthermore, the organic light emitting diode display device can be manufactured through a simple process at lower costs. In addition, advantages of the organic light emitting diode display device include low-voltage operation, high light emitting efficiency, and wide viewing angle. For this reason, the organic light emitting diode display device is considered to be the next generation of a display device.

The organic light emitting diode device can further include a hole injection layer and a hole transport layer that are interposed between the anode and the organic light emitting layer. In this case, holes can be supplied from the anode to the organic light emitting layer through the hole injection layer and the hole transport layer, thereby increasing the light emitting efficiency and lifespan of the organic light emitting diode device.

A method of manufacturing such an organic light emitting diode device includes sequentially forming a hole injection layer, a hole transport layer, and an organic light emitting layer on an anode.

The hole injection layer, the hole transport layer, and the organic light emitting layer can be formed using a vacuum deposition process or a wet process according to materials of the hole injection layer, the hole transport layer, and the organic light emitting layer. For example, a vacuum deposition can be used for a low polymer, and a wet process can be used for a high polymer.

A wet process does not require expensive equipment and can be used for a larger substrate as compared with a vacuum deposition process. Furthermore, the wet process is suitable for mass production since the wet process is simple as compared with the vacuum deposition process.

However, when the wet process is repeatedly used for forming a plurality of organic layers, one organic layer can be dissolved or swelled by a solvent used for forming another organic layer. For example, after forming a hole transport layer using a first solvent, an organic light emitting layer can be formed on the hole transport layer using a second solvent. In this case, the hole transport layer can be dissolved or swelled by the second solvent. Moreover, the organic light emitting layer can be dissolved or swelled by the first solvent remaining on the hole transport layer. For this reason, the first solvent should be highly volatile and have no affect on the organic light emitting layer, and the second solvent should not dissolve the hole transport layer although it dissolves the organic light emitting layer.

Furthermore, when a hole injection layer is formed under the hole transport layer, it is more difficult to select solvents for the respective layers.

For this reason, when an organic light emitting diode device is manufactured using a wet process, it is difficult to form both the hole injection layer and the hole transport layer. Therefore, although the organic light emitting layer is formed in the organic light emitting diode device, both the hole injection layer and the hole transport layer cannot be formed in the organic light emitting diode device (that is, only one of the hole injection layer and the hole transport layer is formed). Moreover, it is also difficult to select materials for the hole injection layer and the hole transport layer.

Therefore, when an organic light emitting diode device is manufactured using a wet process, the light emitting efficiency and lifespan of the organic light emitting diode device can be decreased although manufacturing efficiency is high.

SUMMARY OF THE INVENTION

Accordingly, the present invention is directed to an organic light emitting diode device and a method of manufacturing the organic light emitting diode device that substantially obviates one or more problems due to limitations and disadvantages of the related art.

An advantage of the present invention is to provide an organic light emitting diode device that has an increased light emitting efficiency and lifespan.

Another advantage of the present invention is to provide an organic light emitting diode device that can be manufactured using a large substrate through a simple wet process.

Additional features and advantages of the invention will be set forth in the description which follows, and in part will be apparent from the description, or may be learned from practice of the invention. These and other advantages of the invention will be realized and attained by the structure and method particularly pointed out in the written description and claims hereof as well as the appended drawings.

To achieve these and other advantages and in accordance with the purpose of the invention, as embodied and broadly described herein, an organic light emitting diode device includes: a first electrode formed on a substrate; at least one organic layer formed on the first electrode; an organic light emitting layer formed on the organic layer; and a second electrode formed on the organic light emitting layer, wherein the organic layer is formed of a compound represented by Formula 1 below:

$$R1-(R2)n$$

where R1 is one of a diamine derivative, an arylene diamine derivative, a carbazole derivative, a spiro-arylene diamine derivative, and a starburst amine derivative, R2 is one of C1 to C10 compounds including an oxetane group, and n is an integer ranging from 1 to 8.

In another aspect of the present invention, a method of manufacturing an organic light emitting diode device includes: forming a first electrode on a substrate; forming at least one organic layer on the first electrode; forming an organic light emitting layer on the organic layer; and forming a second electrode on the organic light emitting layer, wherein the organic layer is formed of a compound represented by Formula 1 below:

R1–(R2)n where R1 is one of a diamine derivative, an arylene diamine derivative, a carbazole derivative, a spiro-arylene diamine derivative, and a starburst amine derivative, R2 is one of C1 to C10 compounds including an oxetane group, and n is an integer ranging from 1 to 8.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings.

First Embodiment

Figure 1:
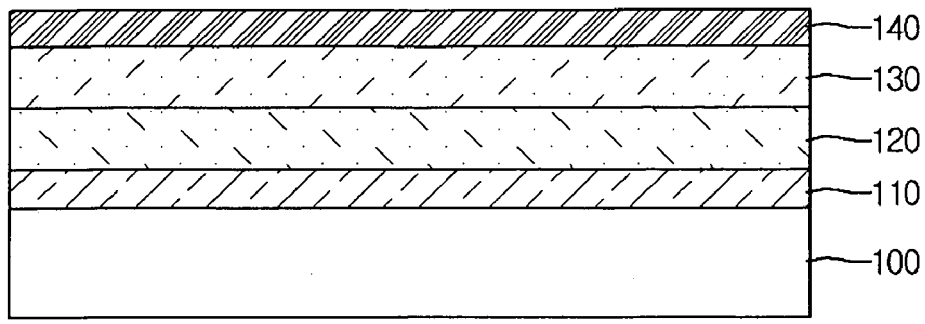
FIG. 1 is sectional view illustrating an organic light emitting diode device according to a first embodiment of the present invention.

FIG. 1 is sectional view illustrating an organic light emitting diode device according to a first embodiment of the present invention. In the following description of the current embodiment, only one organic light emitting diode device included in a pixel will be described for clarity although a number of pixels are used for displaying an image.

Referring to FIG. 1, the organic light emitting diode device includes a first electrode 110, an organic layer 120, an organic light emitting layer 130, and a second electrode 140 that are sequentially formed on a substrate 100.

For example, a plastic substrate, a glass substrate, or a film substrate can be used as the substrate 100. Particularly, when light is transmitted through the substrate 100, the substrate 100 may be formed of a transparent substrate.

The first electrode 110 is formed on the substrate 100. The first electrode 110 may be an anode that supplies holes to the organic light emitting layer 130. The first electrode 110 may be formed of a conductive material capable of transmitting light. For example, the first electrode 110 can be formed of an indium tin oxide (ITO) or an indium zinc oxide (IZO).

The organic layer 120 is formed on the first electrode 110. The organic layer 120 may be a hole injection layer that facilitates discharge of holes from the first electrode 110 to the organic light emitting layer 130. Alternatively, the organic layer 120 may be a hole transport layer that transports holes from the first electrode 110 to the organic light emitting layer 130.

The organic layer 120 may be formed of a compound having the following formula 1:

R1–(R2)n [Formula 1]

where R1 is a substance that transports holes. R1 may be at least one selected from the group consisting of a diamine derivative, an arylene diamine derivative, a carbazole derivative, a spiro-arylene diamine derivative, and a starburst amine derivative. For example, R1 may be one of —N,N'-diphenyl-N,N'-bis(1-naphthyl)-1,1'-biphenyl-4,4"-diamine (α-NPD), N,N1-Bis-(3-methylphenyl)-N,N'-bis-(phenyl)-benzidine (TPD), spiro-TPD, R1 may tris(diphenyl-amino)-trephenylamine (TDATA) and 4,4',4"-Tris(N-3-methylphenyl-N-phenyl-amino)-triphenylamine (MTDATA). Also, the other example of R1 may be any one of 4,4'-bis(2,2'-diphenylvinyl)-1,1'-biphenyl (DPVBi) and spiro-DPVBi.

R2 makes the organic layer 120 less soluble in a solvent by cross-linking molecules of the organic layer 120. Therefore, the organic layer 120 can be minimally affected by a solvent remaining at the organic light emitting layer 130 or included in the organic emitting layer 130. For example, R2 may be one of C1 to C10 compounds with an oxetane group.

In Formula 1, n is an integer ranging from 1 to 8.

For example, Formula 1 can be one of Formulas 2 to 8.

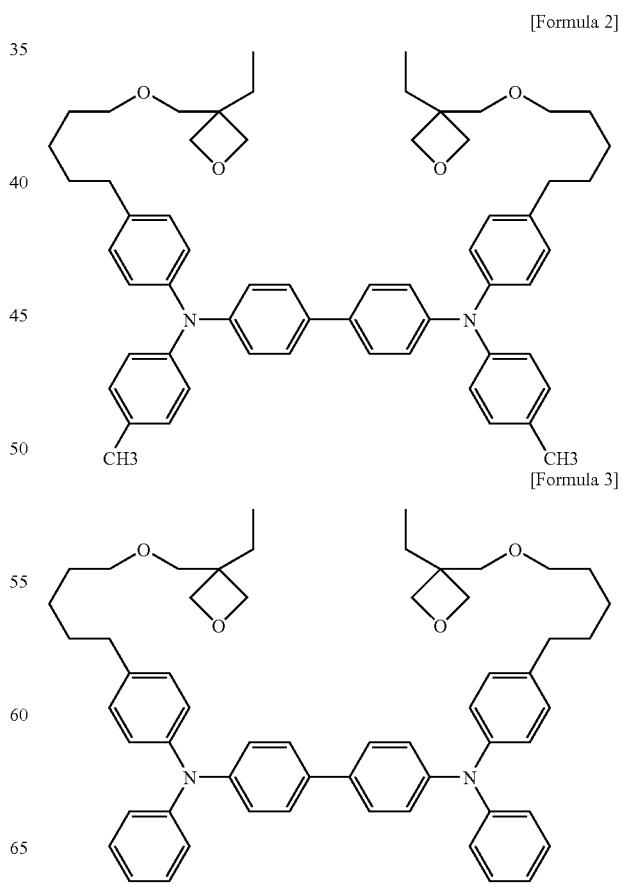

[Formula 4]

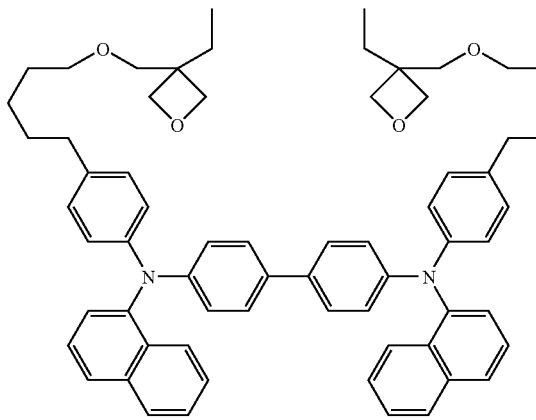

[Formula 5]

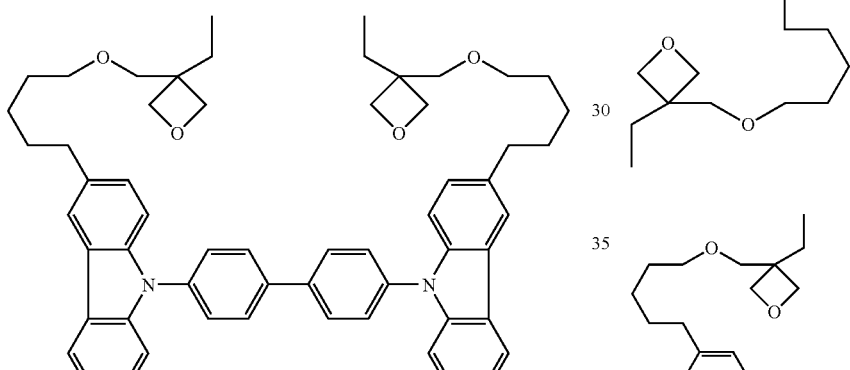

[Formula 6]

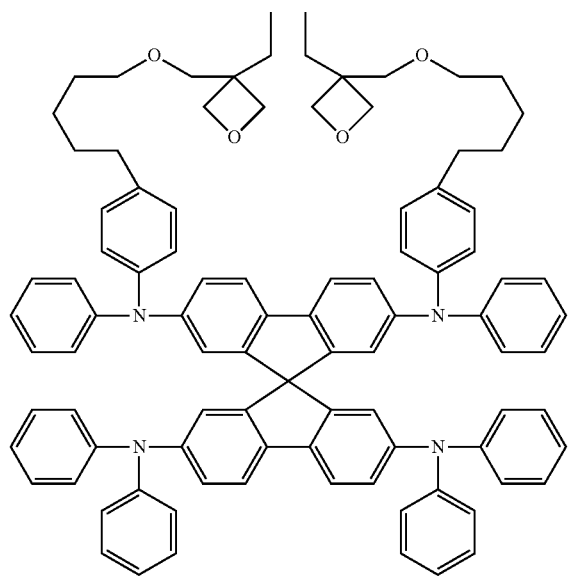

[Formula 7]

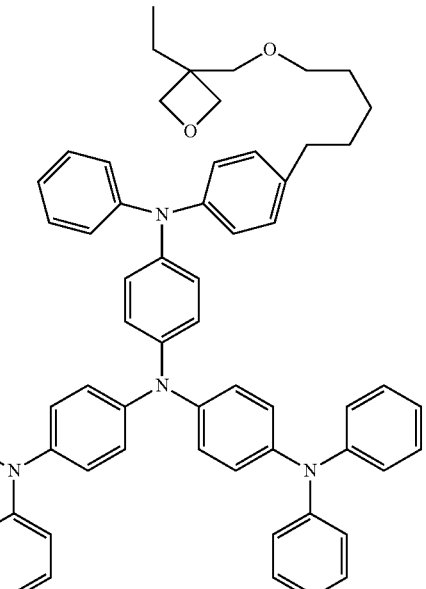

[Formula 8]

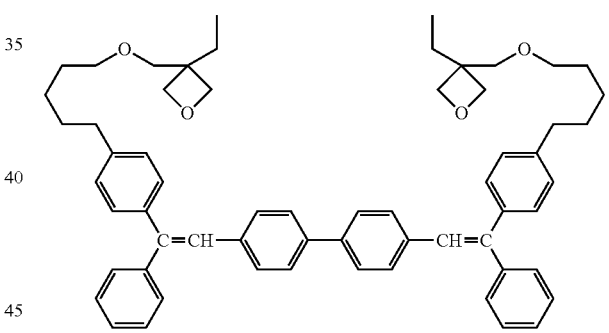

Alternatively, the organic layer 120 may include a hole injection layer and a hole transport layer that are sequentially formed on the first electrode 110. In this case, the hole injection layer may be formed using one of compounds expressed by Formula 7 and 8, and the hold transport layer may be formed using at least one of compounds expressed by Formulas 2 to 6.

The organic light emitting layer 130 is formed on the organic layer 120. Holes supplied from the first electrode 110 recombine with electrons supplied from the second electrode 140 in the organic light emitting layer 130, thereby emitting light.

Examples of a material that can be used for forming the organic light emitting layer 130 include a high polymer and a low polymer. However, the organic light emitting layer 130 can be formed of other materials.

The second electrode 140 is formed on the organic light emitting layer 130. The second electrode 140 supplies electrons to the organic light emitting layer 130.

The second electrode 140 is formed of a conductive material having a work function lower than that of the first electrode 110. For example, the second electrode 140 may be formed of one of Ba, Mg, Ca, Al, Ag, Li, and an alloy thereof.

Optionally, one of an electron transport layer and an electron injection layer (not shown) can be formed between the organic light emitting layer 130 and the second electrode 140.

The electron transport layer transports electrons from the second electrode 140 to the organic light emitting layer 130. In addition, the electron transport layer prevents transferring of electrons from the organic light emitting layer 130 to the second electrode 140. The electron transport layer may be formed of tris-8-hydroxyquinolinato aluminum (Alq3). The electron injection layer facilitates emission of electrons from the second electrode 140. The electron injection layer may be formed of LiF.

Owing to the electron transport layer or the electron injection layer, electrons can be efficiently supplied to the organic light emitting layer 130, and thus the light emitting efficiency and lifespan of the organic light emitting diode device can be increased.

When the organic light emitting diode device of the current embodiment is used for a display device having a number of pixels, the organic light emitting diode device can be disposed in each pixel. In this case, organic light emitting diode devices of pixels can be separated from each other, and a single organic layer can be used for all the pixels as a common organic layer. Alternatively, separate organic layers can be formed in the pixels, respectively, in order to prevent errors lowering image quality such as cross talk. However, in the current embodiment of the present invention, the structure of the organic layer 120 is not limited.

Although not shown, the organic light emitting diode device can be hermetically sealed with a sealing substrate. In this case, the organic light emitting diode device can be protected from moisture and light. Therefore, the organic light emitting diode device is not deteriorated by moisture and light, and thus the lifespan of the organic light emitting diode device can be increased.

In addition, a moisture absorbent can be added to one side of the sealing substrate facing the organic light emitting diode device. The moisture absorbent removes moisture and oxygen remaining in a region sealed by the sealing substrate. Thus, the lifespan of the organic light emitting diode device can be further increased.

In the organic light emitting diode device of the first embodiment, the hole injection layer or the hole transport layer is solvent-resistant. Therefore, the light emitting efficiency and lifespan of the organic light emitting diode device can be increased.

Second Embodiment

FIGS. 2A, 2B, 2C and 2D are sectional views for explaining a method of manufacturing an organic light emitting diode device according to a second embodiment of the present invention.

Figure 2A:
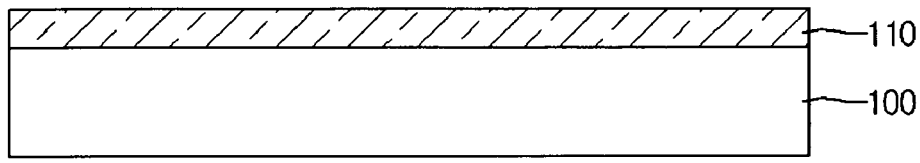
FIGS. 2A, 2B, 2C and 2D are sectional views illustrating a method of manufacturing an organic light emitting diode device according to a second embodiment of the present invention.

Referring to FIG. 2A, to form an organic light emitting diode device, a first electrode 110 is formed on a substrate 100. The first electrode 110 may be formed of a transparent conductive material. For example, the first electrode 110 may be formed of ITO or IZO. The first electrode 110 can be formed by sputtering.

Figure 2B:
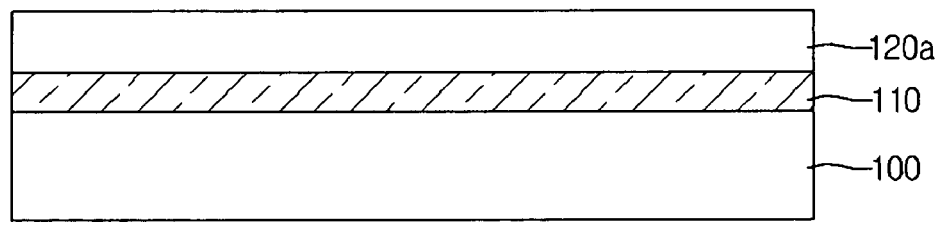

Referring to FIG. 2B, a preliminary organic layer 120a is formed on the first electrode 110. The preliminary organic layer 120a may be formed of a composition including a compound represented by formula 1 below and a photo initiator.

R1–(R2)n [Formula 1]

where R1 may be at least one selected from the group consisting of a diamine derivative, an arylene diamine derivative, a carbazole derivative, a spiro-arylene diamine derivative, and a starburst amine derivative. For example, R1 may be one of N,N'-diphenyl-N,N'-bis(1-naphthyl)-1,1'-biphenyl-4,4''-diamine (α-NPD), N,N'-Bis-(3-methylphenyl)-N,N'-bis-(phenyl)-benzidine (TPD), spiro-TPD, R1 may tris(diphenyl-amino)-trephenylamine (TDATA) and 4,4',4''-Tris(N-3-methylphenyl-N-phenyl-amino)-triphenylamine (MTDATA). Also, the other example of R1 may be any one of 4,4'-bis(2,2'-diphenylvinyl)-1,1'-biphenyl (DPVBi) and spiro-DPVBi. R2 may be one of C1 to C10 compound having an oxetane group. N is an integer ranging from 1 to 8.

The formula-1 compound can be formed by Reaction Formula 1 below:

R1+(R2'–X)n - - - R1–(R2)n+n(HX) [Reaction Formula 1]

where R1 may be one of a diamine derivative, an arylene diamine derivative, a carbazole derivative, a spiro-arylene diamine derivative, and a starburst amine derivative. Each of R2 and R2' is one of C1 to C10 compounds with an oxetane group. X is may be at least one selected from the group consisting of Cl, Br, and F. N is an integer ranging from 1 to 8. MgBr can be used as a catalyst for a reaction represented by Reaction Formula 1.

For example, the formula-1 compound can be one of compounds represented by Formulas 2 to 8 below:

[Formula 2]

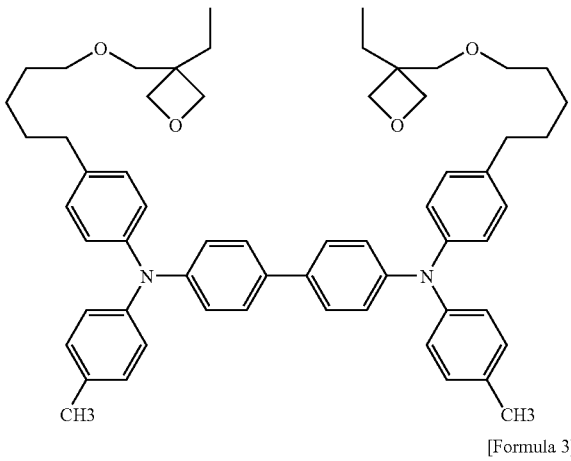

[Formula 3]

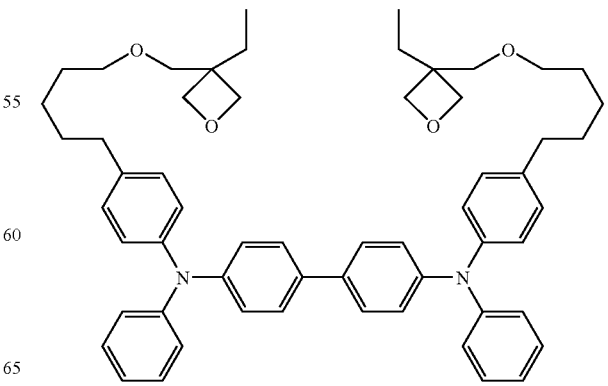

[Formula 4]
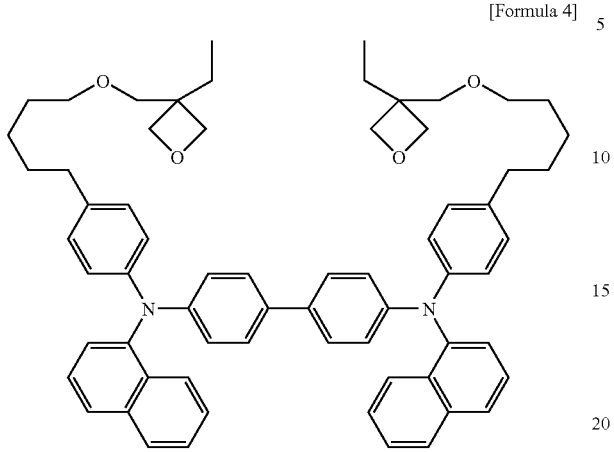
[Formula 5]
[Formula 7]
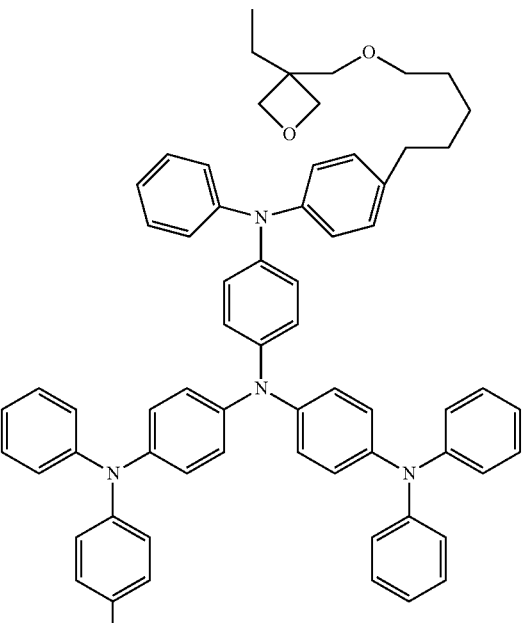
[Formula 6]
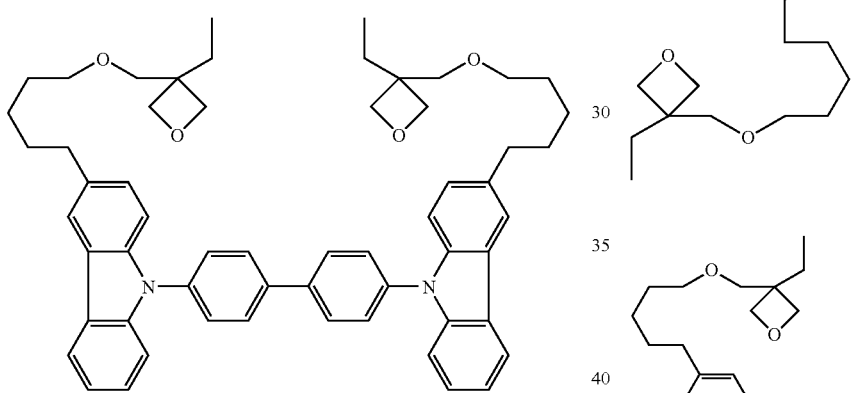
[Formula 8]
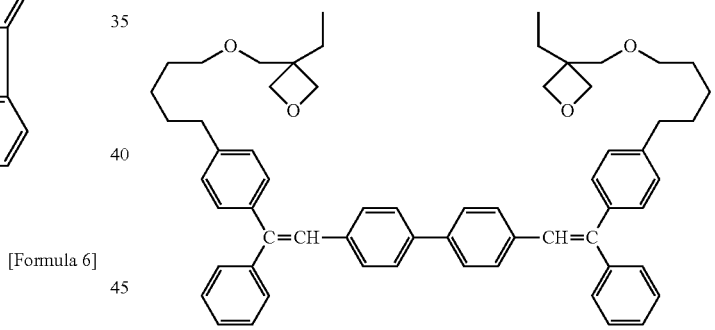
The formula-2 compound can be formed by Reaction formula 2 below:
[Reaction formula 2]
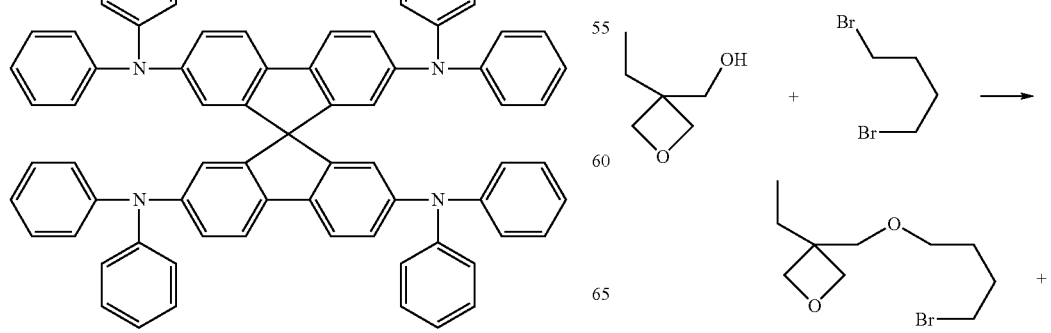

-continued

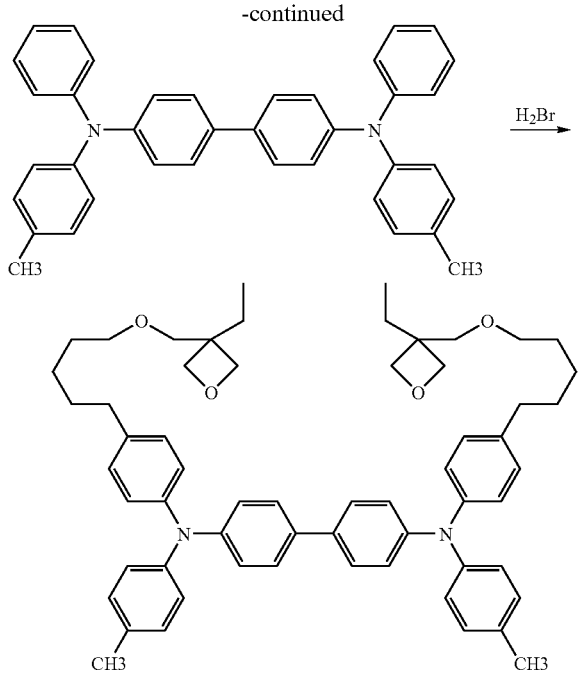

$\xrightarrow{H_2Br}$

The photoinitiator included in the composition used to forming the preliminary organic layer 120a initiates a ring opening reaction of the formula-1 compound, facilitating hardening of the formula-1 compound. The photoinitiator may be a free radical photoinitiator or a cationic photoinitiator. For example, the free radical photoinitiator may be one of alpha-Hydroxy-ketones, a mixture including alpha-Hydroxy-ketones, Phenylglyoxylate, alpha-Amino-ketones, a Benzil dimethyl-ketal, Phosphine oxide, a metal catalyst, an iodonium salt, 4,4'-dihydroxy benzil, benzoin isopropyl ether, benzoin isopropyl ether, 1,4-dibenzoyl benzene, 4-bensoyl biphenyl(4-benzoyl diphenyl ether), 2-Benzoyl naphthalene, 2,2'-Bis(o-chlorophenyl)-4,5,4'5'-tetraphenyl-1,2'-biimidazole, 2,2'-Bis(o-chlorophenyl)-4,5,4'5'-tetrakis(3,4,5-trimethoxyphenyl)-1,2'-biimidazole, and 10-Butyl-2-chloroacridone. The cationic photoinitiator may be a polymer including one of $SbF^6$, $BF^{4-}$, and $AsF^{6-}$.

In the composition including the formula-1 compound and the photoinitiator, the concentration of the photoinitiator is 0.5% to 5% by weight. When the composition includes less than 0.5 weight % of the photoinitiator, the preliminary organic layer 120a is not sufficiently hardened. As a result, an organic layer 120 (describe later) formed by hardening the preliminary organic layer 120a can be damaged when exposed to a solvent. On the other hand, when the composition includes more than 5 weight % of the photoinitiator, the photoinitiator may remain in the organic layer 120. The remaining photoinitiator may affect transportation of holes through the organic layer 120 or cause an organic light emitting layer 130 (described later) to melt or swell.

The preliminary organic layer 120a can be formed through a wet process. Examples of the wet process may include spin coating, spray coating, coating using a doctor blade, inkjet printing, and other printing methods.

Figure 2C:
Figure 2C:
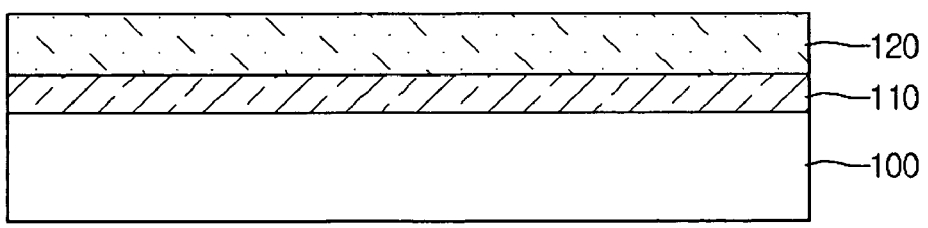

Referring to FIG. 2C, after the preliminary organic layer 120a is formed, light is irradiated onto the preliminary organic layer 120a to form the organic layer 120 by hardening the preliminary organic layer 120. Here, the oxetane group of the formula-1 compound undergoes a ring opening reaction, and thus the preliminary organic layer 120a is hardened. That is, the degree of crosslinking of the organic layer 120 increases, and the organic layer 120 can be solvent-resistant.

The organic layer 120 can be used as a hole transport layer that transports holes from the first electrode 110 to the organic light emitting layer 130, or as a hole injection layer that facilitates discharge of holes from the first electrode 110 to the organic light emitting layer 130.

When the organic light emitting diode device is used for a display device having a plurality of pixels, the organic layer 120 can be commonly used for all the pixels. Alternatively, the organic layer 120 can be divided into parts for the respectively pixels. In the latter case, the preliminary organic layer 120 can be selective exposed to light and developed. The selective exposing can be performed using a mask having a transparent region and an opaque region.

Figure 2D:
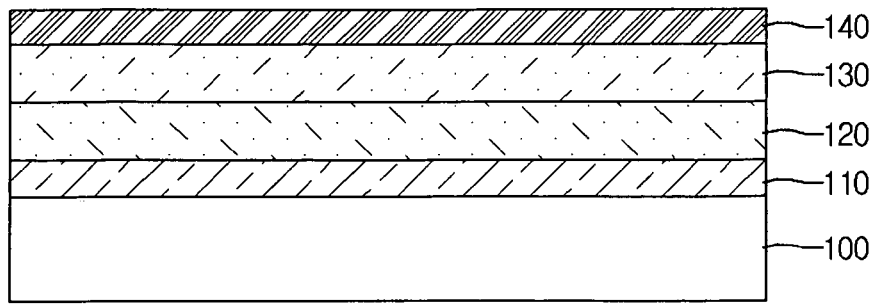

Referring to FIG. 2D, after the organic layer 120 is formed, the organic light emitting layer 130 is formed on the organic layer 120. Examples of a material that can be used for forming the organic light emitting layer 130 include a high polymer and a low polymer. When the organic light emitting layer 130 is formed of a low polymer, a vacuum deposition method can be used. When the organic light emitting layer 130 is formed of a high polymer, a wet process, such as spin coating, inkjet printing, a printing method, and spray coating, can be used. However, in the current embodiment, the organic light emitting layer 130 can be formed in other manners. For example, the organic light emitting layer 130 can be formed of a low polymer through a wet process.

After the organic light emitting layer 130 is formed, a second electrode 140 is formed on the organic light emitting layer 130. The second electrode 140 can be formed by vacuum deposition or sputtering. Examples of a material that may be used for forming the second electrode 140 include Ba, Mg, Ca, Al, Ag, Li, and an alloy thereof.

Before the second electrode 140 is formed, at least one of an electron transport layer, an electron injection layer, and a stacked layer thereof can be additionally formed on the organic light emitting layer 130.

After the second electrode 140 is formed, a sealing process can be additionally performed to seal the organic light emitting diode device including the organic light emitting layer 130 from moisture and oxygen. For example, in the sealing process, a sealing pattern is formed along a periphery of the substrate 100 on which the organic light emitting diode device is formed, and a sealing substrate is bonded to the sealing pattern to cover the organic light emitting diode device. Examples of a material that can be used for the sealing substrate include plastic, glass, and metal.

In the current embodiment, the organic layer 120 is formed in a sing-layer structure. However, the organic layer 120 can be formed in a two-layer structure including a hole injection layer and a hole transport layer, for example. In this case, the hole injection layer of the organic layer 120 can be formed through a wet process and a photocuring process. Then, the hole transport layer of the organic layer 120 can be formed on the hole injection layer through a wet process and a photocuring process. Each of the hole injection layer and the hole transport layer of the organic layer 120 is formed of a compound that can be represented by Formula 1. For example, the hole transport layer can be formed using one of compounds represented by Formulas 2 to 6, and the hole injection layer can be formed using at least one of compounds represented by Formulas 7 and 8.

Therefore, in the current embodiment of the present invention, since the organic layer 120 is photocurable and formed through a wet process, the organic layer 120 can be less affected by a solvent. Thus, after the organic layer 120 is formed, the organic light emitting layer 130 can be formed through a wet process.

In the following description, the present invention is described in more detail according to exemplary embodiments. However, the present invention should not be construed as being limited to the embodiments.

In the following embodiments of the present invention, an organic layer and an organic light emitting diode device like those of FIG. 1 are fabricated and tested to describe the characteristics of the organic layer and the organic light emitting diode device of the first and second embodiments.

Third Embodiment

Formation of First Organic Layer

A substrate 100 is prepared to form a first organic layer on the substrate 100. A cleaned glass substrate is used as the substrate 100.

The first organic layer is formed on the substrate 100 to a thickness of 600 A. The first organic layer is formed of a compound represented by Formula 1. That is, the first organic layer is formed of N,N'-Bis-(3-methylphenyl)-N,N'-bis-(phenyl)-benzidine(TPD) having an oxetane group. The first organic layer is formed through a spin coating process (wet process).

First Comparison Example

Formation of Second Organic Layer

A second organic layer is formed as a first comparison example in the same manner as the first organic layer of the third embodiment except that the second organic layer is formed of N,N'-Bis-(3-methylphenyl)-N,N'-bis-(phenyl)-benzidine (TPD) through a vacuum deposition process.

Figure 3:
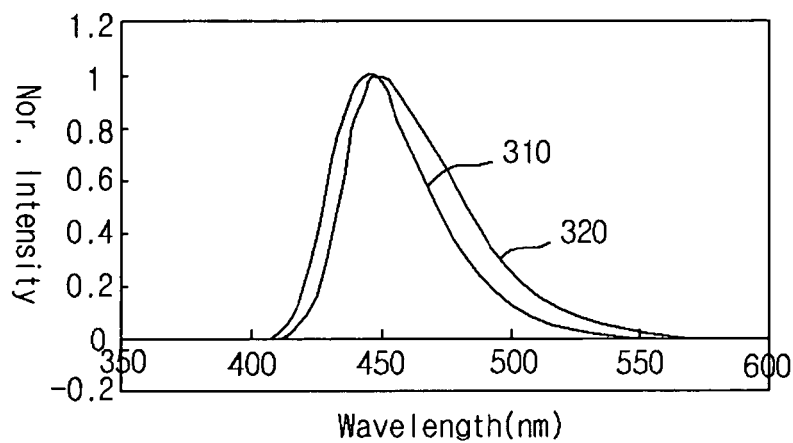
FIG. 3 is a graph illustrating PL spectrums of first and second organic layers.

FIG. 3 is a graph illustrating photoluminescence (PL) spectrums measured from the first and second organic layers, respectively.

Referring to FIG. 3, a PL spectrum curve 310 of the first organic layer is plotted in a wide range of wavelength as compared with a PL spectrum curve 320 of the second organic layer. However, PL peaks of the first and second organic layers are measured at the same wavelength of 450 nm.

Therefore, it can be understood that an oxetane group does not affects the photoluminescence characteristics of an organic layer.

Fourth Embodiment

Formation of First Organic Light Emitting Diode Device

A substrate 100 is prepared to form a first organic light emitting diode device on the substrate 100. A cleaned glass substrate is used as the substrate 100.

ITO is deposited on the substrate 100 by sputtering to form a first electrode 110.

A compound represented by Formula 2 is applied to the first electrode 110 by spin coating to a thickness of about 60 nm and is dried in a vacuum oven at 100° C. for about one hour, thereby forming a first organic layer 120. That is, the first organic layer is formed of N,N'-Bis-(3-methylphenyl)-N,N'-bis-(phenyl)-benzidine(TPD) having an oxetane group.

Polyphenylenevinylene (PPV) is applied to the first organic layer 120 by spin coating to a thickness of 60 nm and is dried in a vacuum oven at 100° C. for about thirty minutes so as to form an organic light emitting layer 130.

Aluminum (Al) is deposited on the organic light emitting layer 130 to form a second electrode 140.

Second Comparison Example

Formation of Second Organic Light Emitting Diode Device

A second organic light emitting diode device is formed as a second comparison example in the same manner as the first organic light emitting diode device of the fourth embodiment except that a second organic layer is formed of N,N'-Bis-(3-methylphenyl)-N,N'-bis-(phenyl)-benzidine (TPD) through a vacuum deposition process.

Figure 4:
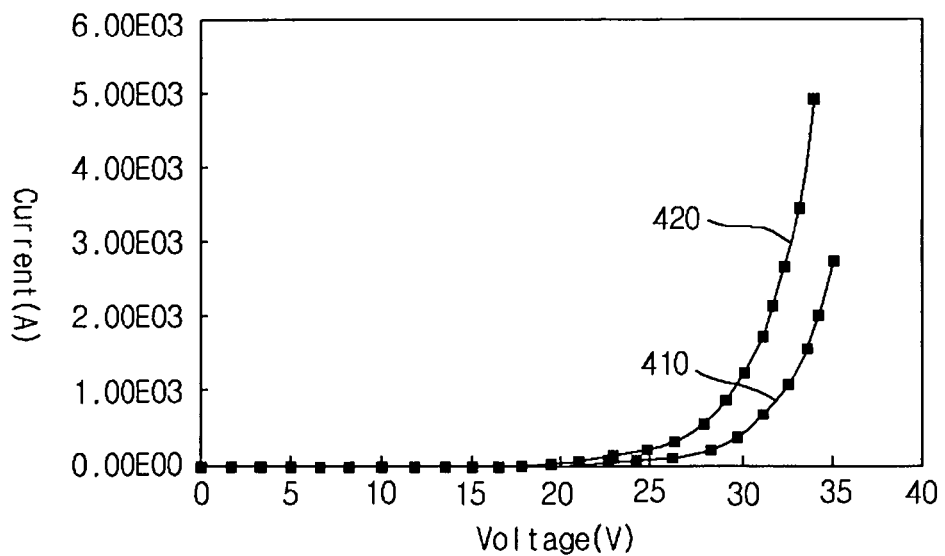
FIG. 4 is a graph illustrating current-voltage characteristics of first and second organic light emitting diode devices.

FIG. 4 is a graph illustrating current-voltage characteristics measured from the first and second organic light emitting diode devices, respectively.

Referring to FIG. 4, a current-voltage curve 410 of the first organic light emitting diode device is similar to a current-voltage curve 420 of the second organic light emitting diode device. Therefore, it can be understood that an oxetane group does not largely affects the current-voltage characteristics of an organic light emitting diode device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. An organic light emitting diode device comprising:
a first electrode formed on a substrate;
at least one organic layer formed on the first electrode;
an organic light emitting layer formed on the organic layer;
an
a second electrode formed on the organic light emitting layer,
wherein the organic layer is formed of any one of the compounds represented by Formulas 2 to 7 below:

[Formula 2]

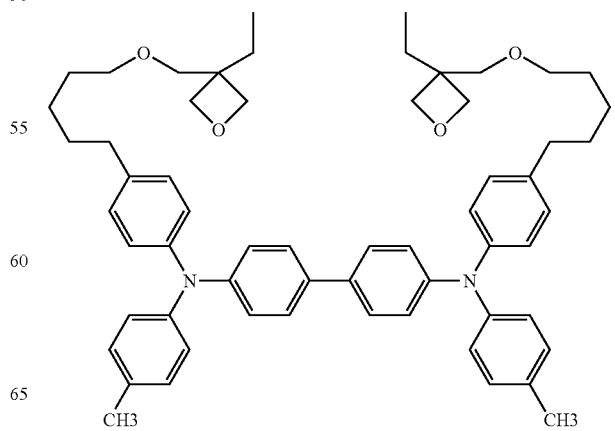

[Formula 3]

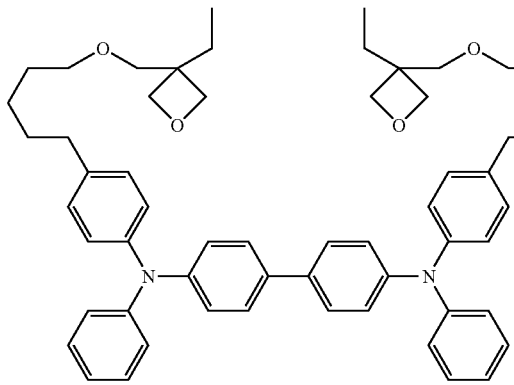

[Formula 4]

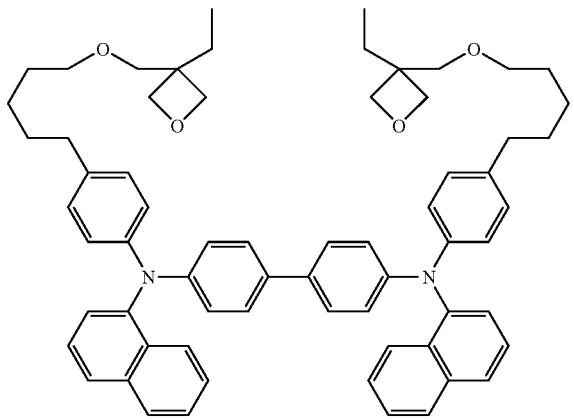

[Formula 5]

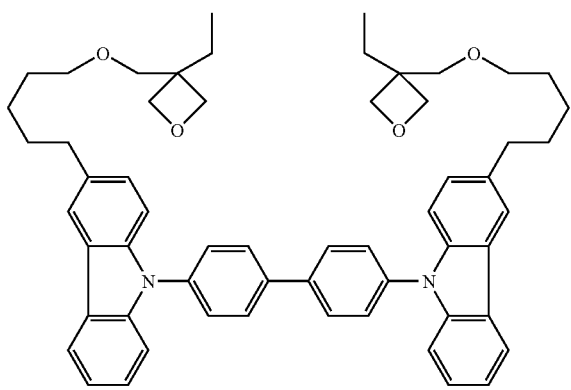

[Formula 6]

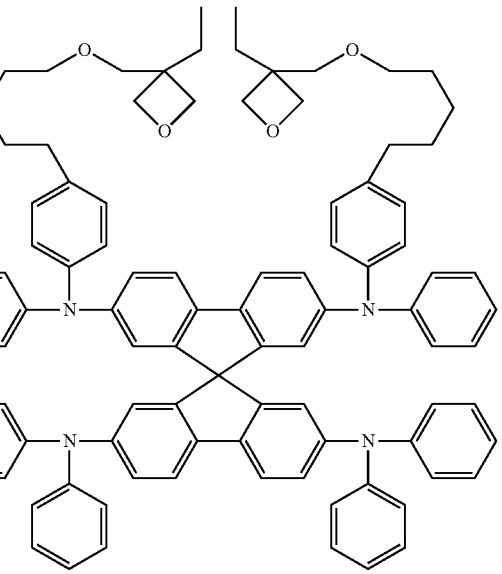

[Formula 7]

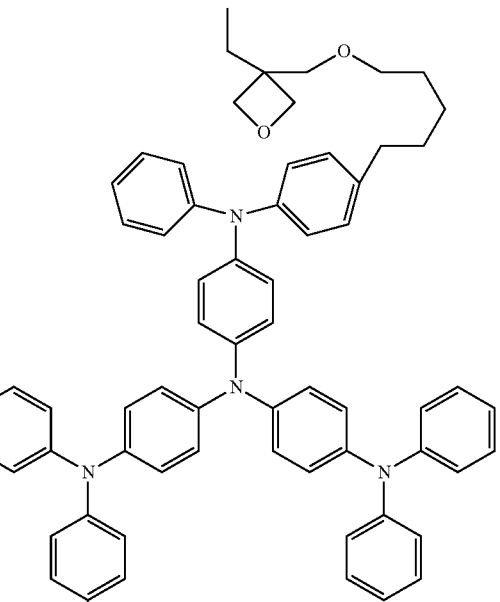

2. The organic light emitting diode device according to claim 1, wherein the organic layer comprises a hole injection layer that facilitates emission of holes from the first electrode to the organic light emitting layer.

3. The organic light emitting diode device according to claim 1, wherein the organic layer comprises a hole transport layer that transports holes from the first electrode to the organic light emitting layer.

4. The organic light emitting diode device according to claim 1, wherein the organic layer comprises:
 a hole injection layer formed of the first electrode that facilitates emission of holes from the first electrode; and a hole transport layer formed on the hole injection layer that transports holes from the hole injection layer to the organic light emitting layer.

5. A method of manufacturing an organic light emitting diode device, the method comprising:

forming a first electrode on a substrate;

forming at least one organic layer on the first electrode;

forming an organic light emitting layer on the organic layer; and forming a second electrode on the organic light emitting layer, wherein the organic layer is formed of any one of the compounds represented by Formulas 2 to 7 below:

[Formula 2]

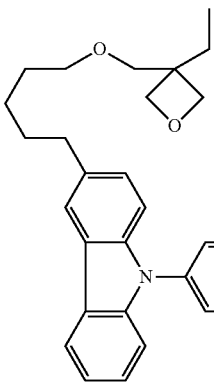

[Formula 3]

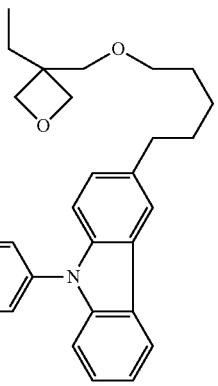

[Formula 4]

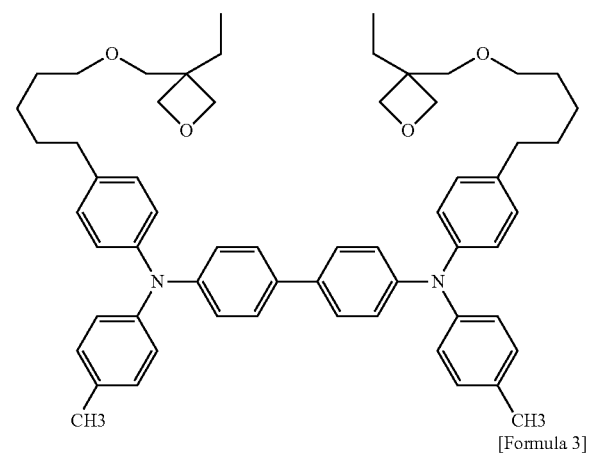

[Formula 5]

[Formula 6]

[Formula 7]

6. The method according to claim 5, wherein a composition for forming the organic layer further comprises a photoinitiator.

7. The method according to claim 6, wherein the photoinitiator is one of a free radical photoinitiator and a cationic photoinitiator.

8. The method according to claim 6, wherein the photoinitiator has a concentration of about 0.5 to about 5 weight percent based on an entire weight of any one of the compounds represented by Formulas 2 to 7 and the photoinitiator.

9. The method according to claim 5, wherein the forming of the organic layer comprises:
forming a preliminary organic layer by coating the compound on the first electrode; and
curing the preliminary organic layer.

10. The method according to claim 9, wherein curing of the preliminary organic layer comprises selectively irradiating light to the preliminary organic layer.

11. The method according to claim 5, wherein the forming of the organic light emitting layer is performed through a wet process.

12. The method according to claim 5, wherein the forming of the organic light emitting layer is performed through a deposition process.

13. An organic light emitting diode device comprising:
a first electrode formed on a substrate;
at least one organic layer formed on the first electrode;
an organic light emitting layer formed on the organic layer; and
a second electrode formed on the organic light emitting layer,
wherein the organic layer is formed of a compound represented by Formula 1 below:

R1–(R2)$_n$ where R1 is one of a 4,4'-bis(2,21-diphenylvinyl)-1,1'-biphenyl (DPVBi) and spiro-DPVBi, R2 is a compound with an oxetane group wherein the R2 compound has no more than 10 carbon atoms, and n is an integer ranging from 1 to 8.

14. An organic light emitting diode device comprising:
a first electrode formed on a substrate;
at least one organic layer formed on the first electrode;
an organic light emitting layer formed on the organic layer; and
a second electrode formed on the organic light emitting layer,
wherein the organic layer is formed of a compound represented by Formula 8

[Formula 8]

15. An organic light emitting diode device comprising:
a first electrode formed on a substrate;
at least one organic layer formed on the first electrode;
an organic light emitting layer formed on the organic layer; and
a second electrode formed on the organic light emitting layer,
wherein the organic layer is formed of a compound represented by Formula 1 below:

R1–(R2)$_n$ wherein R1 is one of N,N'-diphenyl-N,N'-bis(1-naphthyl)-1,1'-biphenyl-4,4"-diamine
(α-NPD), tris(diphenyl-amino)-triphenylamine (TDATA), 4,4',4"-Tris(N-3-methylphenyl-N-phenyl amino)-triphenylamine (MTDATA), R2 is a compound with an oxetane group wherein the R2 compound has no more than 10 carbon atoms, and n is an integer ranging from 1 to 8.

* * * * *